United States Patent [19]

Chappell et al.

[11] Patent Number: 5,089,726
[45] Date of Patent: Feb. 18, 1992

[54] FAST CYCLE TIME CLOCKED AMPLIFIER

[75] Inventors: Barbara A. Chappell; Terry I. Chappell, both of Amawalk; Stanley E. Schuster, Granite Springs, all of N.Y.

[73] Assignee: International Business Machines Corporation, Armonk, N.Y.

[21] Appl. No.: 620,512

[22] Filed: Nov. 29, 1990

[51] Int. Cl.[5] ............... H03F 3/45; H03K 19/094
[52] U.S. Cl. ............... 307/530; 307/451; 365/189.07; 365/204; 365/205
[58] Field of Search ............... 307/443, 448, 451–452, 307/475, 530, 355–356; 365/189.07, 204, 205

[56] References Cited

U.S. PATENT DOCUMENTS

| | | | |
|---|---|---|---|
| 4,479,202 | 10/1984 | Uchida | 365/190 |
| 4,604,533 | 8/1986 | Miyamoto et al. | 307/530 |
| 4,627,033 | 12/1986 | Hyslop et al. | 365/205 |
| 4,645,954 | 2/1987 | Schuster | 307/475 |
| 4,654,831 | 3/1987 | Venkatesh | 365/207 |
| 4,694,205 | 9/1987 | Shu et al. | 307/530 |
| 4,716,320 | 12/1987 | McAdams | 307/530 |
| 4,724,344 | 2/1988 | Watanabe | 307/530 |
| 4,791,324 | 12/1988 | Hodapp | 307/530 |
| 4,845,675 | 7/1989 | Krenik et al. | 365/205 |
| 4,845,677 | 7/1989 | Chappell et al. | 365/189.02 |

OTHER PUBLICATIONS

B. A. Chappell et al., CMOS Preamplifier/Clocked Amplifier For ECL Conversion, IBM Technical Disclosure Bulletin, vol. 31, No. 7, Dec. 1988, p. 280.

F. Towler et al., "A 128k 6.5ns Access/5ns Cycle CMOS ECL Static RAM", 1989, IEEE International Solid-State Circuits Conference Digest of Tech. Papers.

S. H. Dhong et al., High Density Memory Cell Structure With Two Access Transistors, IBM Technical Disclosure Bulletin, vol. 31, No. 7, Dec. 1988, p. 409.

Primary Examiner—Stanley D. Miller
Assistant Examiner—Margaret Rose Wambach
Attorney, Agent, or Firm—Robert M. Trepp

[57] ABSTRACT

A circuit incorporating a clocked first stage and unlocked second and third stages with amplification for driving capacitance loads with the output nodes each coupling its changed state back to the earlier stages to reset them independent of the clock. The circuit may use complementary metal-oxide semiconductor devices of various gate widths.

22 Claims, 2 Drawing Sheets

FAST CYCLE TIME CLOCKED AMPLIFIER

FIELD OF THE INVENTION

This invention relates to amplifiers and more particularly to amplifiers for use in semiconductor memories i.e. address amplifiers.

BACKGROUND OF THE INVENTION

In U.S. Pat. No. 4,845,677 which issued on July 4, 1989 to Chappell et al., entitled "Pipelined Memory Chip Structure Having Improved Cycle Time", a semiconductor random access memory chip is described wherein the cycle time is less than the access time for any combination of read or write sequence. The memory chip operates in a pipeline manner with more than one access propagating through the chip at any given time and wherein the cycle time is limited by subarray cycles.

U.S. Pat. No. 4,791,324 which issued Dec. 13, 1988 to Hodapp is entitled "CMOS Differential-Amplifier Sense Amplifier" and describes a CMOS sense amplifier for use in a memory that includes two CMOS differential amplifiers. Each differential amplifier receives the same two signals generated from a selected bit line pair and each provides a different one of a complementary pair of signals. U.S. Pat. No. 4,724,344 which issued on Feb. 9, 1988 to Watanabe is entitled "Sensing Amplifier Including Symmetrical And Asymmetrical Load Circuits" and describes a sense amplifier for a random access memory having a first differential amplifying circuit formed of a first pair of transistors having their sources connected together, their gates supplied with differential input signals, and their drains connected with symmetrical type active loads. The second differential amplifying circuit is of a current mirror type formed of a pair of transistors which is connected in series with the first differential amplifying circuit.

In U.S. Pat. No. 4,716,320 which issued on Dec. 29, 1987 to McAdams, entitled "CMOS Sense Amplifier With Isolated Sensing Nodes", a CMOS sense amplifier is described which has the capacitance of the bit lines isolated from the sensing nodes, which allows the sensed differential voltage to be amplified faster than in current CMOS sense amplifiers, since the sensing nodes have significantly lower capacitance than the bit lines.

U.S. Pat. No. 4,694,205 issued on Sept. 15, 1987 to Shu et al. is entitled "Midpoint Sense Amplification Scheme For A CMOS DRAM" and discloses a CMOS, midpoint sense amplification system for controlling the dynamics of the sense amplification phase of the sense cycle of a CMOS DRAM. The system includes a tracking circuit for initiating the first stage of the sense amplification phase when the differential voltage signal attains a first predetermined value.

In U.S. Pat. No. 4,654,831 which issued on Mar. 31, 1987 to Venkatesh, entitled "High Speed CMOS Current Sense Amplifier", a CMOS current sense amplifier circuit is described for providing a high speed of operation that includes a sense amplifier, a dummy sense amplifier and an operational sense amplifier.

In U.S. Pat. No. 4,645,954 issued Feb. 24, 1987 to Schuster entitled "ECL to FET Interface Circuit For Field Effect Transistor Arrays", an interface circuit is described for coupling bipolar ECL logic circuit signals to an FET logic array. The interface receives chip select signals and their complement on a dual rail input line. A small signal amplifier comprising a FET amplifier having an input FET transistor connected through its source and gate to the dual rail input terminals, converts the chip enable signal to a high level clocking signal. An FET dynamic sense amplifier receives a bipolar ECL logic level to be converted to an FET logic level, and receives a reference level from the bipolar transistor logic circuit. Upon clocking of the dynamic sense amplifier by the small signal amplifier, the true and complementary FET logic levels corresponding to the input bipolar logic levels are provided by the dynamic sense amplifier.

U.S. Pat. No. 4,627,033 which issued on Dec. 2, 1986 to Hyslop et al. is entitled "Sense Amplifier With Reduced Instantaneous Power" and describes a CMOS sense amplifier circuit for a dynamic read/write memory that employs cross-coupled n-channel transistors and cross-coupled p-channel transistors returned to the voltage supply and ground through two separate sets of p and n channel transistors selectively activated by sense clocks.

In U.S. Pat. No. 4,604,533 which issued on Aug. 5, 1986 to Miyamoto et al., entitled "Sense Amplifier," a sense amplifier is described including a first differential amplifier and a second differential amplifier. The first differential amplifier has a pair of bipolar transistors as differential input elements which respectively receive differential input signals from a MOS circuit. The second differential amplifier has a pair of MOS transistors as differential input elements which respectively receive differential output signals generated from the first differential amplifier.

In U.S. Pat. No. 4,479,202 which issued on Oct. 23, 1984 to Uchida, entitled "CMOS Sense Amplifier," a memory circuit is described that comprises a plurality of memory cells and a plurality of sense circuits each including first and second input MOS transistors and first and second load MOS transistors of a first channel type and a load circuit connected to the sense circuit and including first to fourth load MOS transistors of a second channel type. The first and second input MOS transistors have their sources connected to each other and their gates connected to receive a differential input signal there between from said memory circuits of the first and second switching transistors which have their sources connected respectively to the drains of said first and second input transistors and their gates connected to a column selection signal.

In the IBM Technical Disclosure Bulletin, Volume 31, No. 7, December 1988 at page 280, a publication entitled "CMOS Preamplified/Clocked Amplifier For ECL Conversion" discloses a CMOS preamplifier/clocked used in the conversion of ECL signal to the large signals used for CMOS devices. A CMOS preamplifier/clocked amplifier receiver which converts small interface signals, such as found in systems using emitter coupled logic (ECL), to the large signals used for complementary metal-oxide-semiconductor (CMOS) devices with high speed and with good tolerances to parametric variations is shown in FIG. 2 of the publication.

In the IBM Technical Disclosure Bullentin, Vol. 31, No. 7, December 1988 at page 409, a publication entitled "High Density Memory Cell Structure with Two Access Transistors" a technique is described whereby a high density dynamic random-access memory cell structure incorporates a pair of access transistors and a capacitor, thereby reducing the structural size of memory cells and improving the immunity to noise.

In a paper by Towler et al. entitled "A128K 6.5 ns Access/5ns Cycle CMOS ECL Static RAM" found in 1989 IEEE ISSCC Digest of Technical Papers, p. 30-31; February, 1989, a pipelined chain of self-resetting circuit macros, initiated by a single clock is shown in FIG. 2. Each block generates its own local reset, allowing the address amplifiers to reset while the decoders are resolving, and the decoders to reset while the subarray is selected and output data is latched. The y-address buffer circuit shown in FIG. 3 of the publication illustrates ECL to CMOS conversion and fast drive development combined with the fast cycle capability which is necessary for pipeline operation. A NOR circuit coupled to output of the buffer circuit initiates fast resetting of the critical path in the buffer circuit.

SUMMARY OF THE INVENTION

An object of the present invention is to provide a clocked amplifier with selfresetting for fast cycle time.

A further object of the present invention is to provide a clocked amplifier with self-resetting with low power consumption.

A further object of the present invention is to provide a clocked amplifier with self-setting with minimized input loading on the clock signal.

A further object of the present invention is to provide a clocked amplifier with self-resetting for use in memory circuits wherein the cycle time of the amplifier is less than the access time of the whole memory chip.

Yet a further object of the present invention is to provide a clocked amplifier with self-resetting to amplify ECL level address input signals and to drive large address decoder loads.

Still another object of the present invention is to provide a clocked amplifier with self-resetting having a built-in delay to provide pulsed signals having a predetermined pulse width for driving the next stage.

In accordance with the present invention, an apparatus is described for amplifying an input signal comprising a first field effect transistor having its source adapted for coupling to ground or for coupling to a first voltage supply, its drain coupled to a first output node and its gate adapted for coupling to the input signal, a second field effect transistor having its source adapted for coupling to ground or to a first voltage supply, its drain coupled to a second output node and its gate adapted for coupling to the complement of the input signal or to a reference signal, a first current source coupled to the first output node and a second current source coupled to the second output node, the first and second current sources may be pair of cross-coupled p-channel transistors acting as a latch coupled to the first and second output nodes and commonly fed by a clocked transistor which may be a p-channel having its source adapted for coupling to a second voltage supply and its gate coupled to the clock input, a pair of field effect transistors coupled to the first and second output nodes with their sources coupled to ground and their gates coupled to a clock input for presetting the voltage of the first and second nodes to a second voltage, for example ground potential, at first times and for disabling the transistors at second times in response to the clock signal whereby at second times the first and second output nodes respond to the input signal, the first output node coupled through a first and second inverter to a third output node, the second output node coupled through a third and fourth inverter to a fourth output node, first logic means, for example logic gates coupled to the third output node into the first output node, for resetting after a predetermined first delay the voltage of the first node to ground potential at times the third output node goes to a fourth voltage from a third voltage, and second logic means, which may include inverters coupled to the fourth output node and to the second output node, for resetting after a predetermined second delay the voltage of the second node to ground potential at times the fourth output node goes to a fourth voltage from a third voltage, whereby a changed output state of the third or the fourth node generates a signal to reset the changed nodes of the amplifier thereby reducing cycle time and power consumption.

DESCRIPTION OF THE PREFERRED EMBODIMENT

Figure 1:
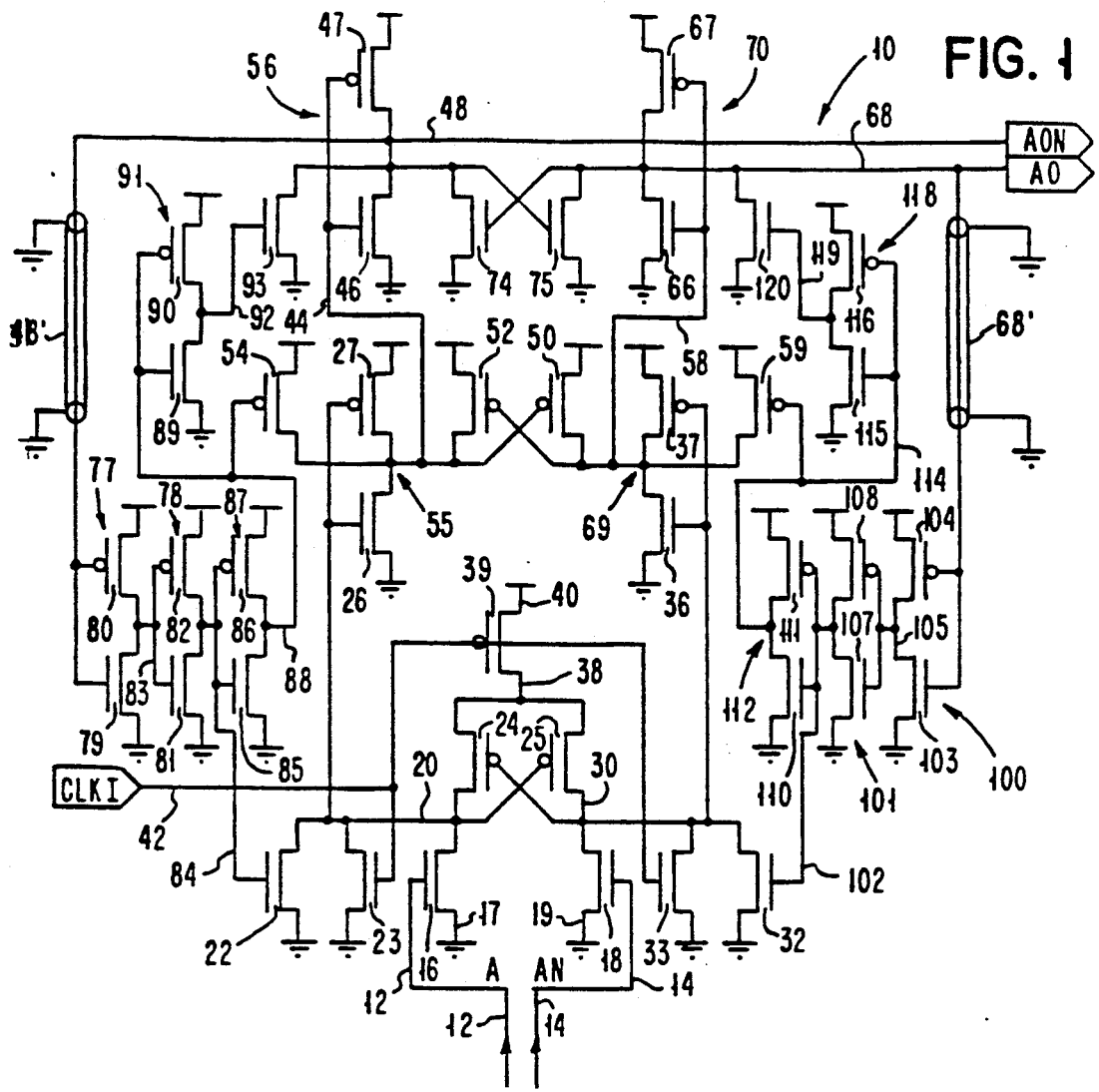
FIG. 1 is a schematic diagram of one embodiment of the invention.

Referring to the drawing and in particular to FIG. 1, a circuit 10 is shown for amplifying an input signal which is coupled to circuit 10 on lead 12. In FIG. 1, a device having a circle on the gate lead, as shown in device 24, is a p-channel metal-oxide-semiconductor field-effect transistor (MOSFET) whereas a device without a circle on the gate lead, as shown in device 16, is an n-channel MOSFET. A reference signal which may be for example the complement of the input signal is coupled to lead 14. Lead 12 is coupled to the gate of field effect transistor 16 having its source coupled over lead 17 to a first voltage supply which may be for example ground potential. Lead 14 is coupled to the gate of field effect transistor 18 having its source coupled over lead 19 to a first voltage supply for example ground potential. The drain of transistor 16 is coupled over lead 20 to the drains of transistors 22-24 and the gates of transistors 25-27. The drain of transistor 18 is coupled over lead 30 to the drains of transistors 32, 33, and 25 and the gates of transistors 24, 36 and 37. The sources of transistors 24 and 25 are coupled together over lead 38 to the drain of transistor 39 having its source coupled to a second voltage supply over lead 40. A clock signal may be coupled over lead 42 to the gates of transistors 23, 33, and 39. The sources of transistors 22, 23, 26, 32, 33, and 36 are coupled to the first voltage supply which may be for example at ground potential. The sources of transistors 27 and 37 are coupled to a second voltage supply.

Lead 20 may be called node 1 and receives current through transistors 39 and 24 from a second voltage supply. Lead 30 which may be called node 2 and receives current through transistors 39 and 25. Transistors 24 and 25 having the drain of one coupled to the gate of the other form a cross-coupled latch to steer current passing through transistor 39 to either node 1 or node 2. A clock signal on lead 42 functions to preset the voltage on the first and second nodes to the first supply voltage by causing transistors 23 and 33 to be conducting at first times, for example when the clock signal on lead 42 is high with respect to ground potential. When the clock signal on lead 42 is low, transistors 33 and 23 are turned off and transistor 39 is turned on causing current to be directed to nodes 1 and 2 through transistors 24 and 25 until either node 1 or 2 goes high causing the respective gate of transistors 25 or 24 to go high causing that transistor to turn off. The remaining transistor that is on, either transistor 24 or 25, continues to conduct current to node 1 or node 2 respectively. Whether node 1 or node 2 goes high depends upon the current through transistors 16 and 18 which in turn depends upon the voltage on leads 12 and 14. The lead 12 or 14 with the highest voltage will cause transistor 16 or 18 respectively to draw more current and pull node 1 or 2 respectively to a lower voltage. The node 1 or 2 with the lowest voltage will cause transistor 25 or 24 respectively to be more conductive and to pass more current. The transistor pulling the most current will tend to pull the node it is coupled to higher. When true and complement CMOS-level signals are provided on leads 12 and 14 respectively, one of transistors 16 and 18 is turned off while the other is turned on. The latch formed by transistors 24 and 25 tend to preserve the state of nodes 1 and 2 after they are set, by the clock signal on lead 42 going low, thereby resisting any change due to noise.

The output of node 1 on lead 20 is coupled through an inverter 55 formed by transistors 26 and 27 to lead 44 to a second inverter 56 formed by transistors 46 and 47 to provide an output on lead 48 which may be called node 3. Lead 44 is coupled to the gates of transistors 46, 47 and 50, and the drains of transistors 26, 27, 52 and 54. The sources of transistors 47, 50, 52 and 54 are coupled to a second voltage supply. The source of transistor 46 is coupled to the first voltage supply which may be for example at ground potential. Transistors 26 and 27 function as a complementary metal-oxide-semiconductor (CMOS) first inverter 55. Transistors 46 and 47 function as a CMOS second inverter 56. Therefore, the voltage level on node 1, lead 20, is also the voltage on node 3, lead 48, after a time delay through the first and second inverters. To provide a large conductance gain when the input signal on lead 14 is higher than the input signal on lead 12, transistor 26 is made larger than transistor 16 and transistor 47 is made larger than transistor 26.

The drains of transistors 36 and 37 are coupled together over lead 58 and to the drains of transistors 50 and 59 and the gates of transistors 52, 66 and 67. The sources of transistors 59 and 67 are coupled to a second voltage supply. The source of transistor 66 is coupled to a first voltage supply which may be for example ground potential. The drains of transistor 66 and 67 are coupled together over lead 68 which may be called node 4. Transistors 36 and 37 function as a third CMOS inverter 69. Transistors 66 and 67 function as a fourth CMOS inverter 70. Therefore, the output of node 2 on lead 30 has the same voltage level as lead 68, node 4 after passing through and accounting for the time delay of third inverter 69 and fourth inverter 70. To provide a large conductance gain when the input signal on lead 12 is higher than the input signal on lead 14, transistor 36 is made larger than transistor 18 and transistor 67 is made larger than transistor 36.

Transistors 50 and 52 have their respective drain coupled to the gate of the other transistor to form a cross-coupled latch to improve noise resistance. When the voltage on leads 44 and 58 are complementary, one transistor, 50 or 52, is turned off while the other transistor is turned on thereby reinforcing the signals on leads 44 and 58, especially the lead that is at a high voltage level.

The sources of transistors 74 and 75 are coupled to the first voltage supply which may be for example ground. The drain of transistor 74 is coupled to lead 48 and the drain of transistor 75 is coupled to lead 68. Transistors 74 and 75 function as a latch with the drain of one transistor coupled to the gate of the gate of the other.

Transistors 74 and 75 function to latch at times a complementary voltage appears on leads 48 and 68 causing one transistor to be turned on and the other to be turned off to reinforce the voltages on leads 48 and 68. The voltage that is low is especially reinforced by the transistor that is turned on being conductive to ground.

If the voltage on node 3, lead 48, is high, then the voltage level is coupled through CMOS inverters 77 and 78 to the gate of transistor 22 which is turned on causing the voltage on node 1, lead 20 to go low. Transistor 22 should have sufficient conductivity, such as twice the conductivity of transistor 24, in order to pull node 1 low. Inverter 77 comprises transistors 79 and 80 while inverter 78 comprises transistors 81 and 82. Lead 48 is coupled to the gates of transistors 79 and 80. The drains of transistors 79 and 80 are coupled together over lead 83 to the gates of transistors 81 and 82. The drains of transistors 81 and 82 are coupled together over lead 84 to the gates of transistors 22, 85 and 86. Transistors 85 and 86 function as CMOS inverter 87. The drains of transistors 85 and 86 are coupled together over lead 88 to the gate of transistor 54 and the gates of transistors 89 and 90. Transistors 89 and 90 function as CMOS inverter 91. The drains of transistor 89 and 90 are coupled together over lead 92 to the gate of transistor 93. Transistor 93 has its source coupled to the first voltage supply which may be ground potential and its drain coupled to lead 48. Inverter 87 functions to provide a low voltage on lead 88 when the input voltage on lead 84 is high to cause transistor 54 to be conducting pulling lead 44 high. The low voltage on lead 88 passes through inverter 91 to provide a high voltage on lead 92 causing transistor 93 to be conductive pulling the voltage on lead 48, node 3, low. The low voltage on node 1, lead 20, also passes through inverters 55 and 56 to provide a low voltage on lead 48.

When the voltage on node 4, lead 68, is high, the voltage level passes through CMOS inverters 100 and 101 over lead 102 to the gate of transistor 32 causing transistor 32 to be conductive pulling node 2, lead 30, low. Transistor 32 should have sufficient conductivity, such as twice the conductivity of transistor 25, in order to pull node 2 low. Inverter 100 comprises transistors 103 and 104 while inverter 101 comprises transistors 107 and 108. Lead 68 is coupled to the gates of transistors 103 and 104. The drains of transistors 103 and 104 are coupled together over lead 105 to the gates of transistors 107 and 108. The drains of transistors 107 and 108 are coupled together over lead 102 to the gates of transistors 32, 110 and 111. Transistors 110 and 111 function as CMOS inverter 112. The drains of transistors 110 and 111 are coupled together over lead 114 to the gate of transistor 59, and the gates of transistors 115 and 116. Transistors 115 and 116 function as CMOS inverter 118. The drains of transistors 115 and 116 are coupled together over lead 119 to the gate of transistor 120. Transistor 120 has its source coupled to the first voltage supply which may be ground potential and its drain coupled to lead 68. Inverter 112 functions to provide a low voltage on lead 114 when the input voltage on lead 102 is high to cause transistor 59 to be conducting pulling lead 58 high. The low voltage on lead 114 passes through inverter 118 to provide a high voltage on lead 119 causing transistor 120 to be conducting and pulling the voltage on lead 68, node 4, low. The low voltage on node 2, lead 30, also passes through inverters 69 and 70 to provide a low voltage on lead 68.

Leads 48 and 68 may also be coupled through transmission lines 48' and 68' respectively which may be in the form of a strip line, microstrip line, lumped capacitances, or coaxial line to provide a fixed time delay. Transmission line 48' may replace inverters 77 and 78 shown in FIG. 1. Transmission line 68' may replace inverters 100 and 101 shown in FIG. 1. Other inverters may be combined with or replaced by other transmission lines where a fixed time delay is desired and where current gain is not needed for charging capacitances.

From the above descriptions, the effects of a high voltage level on output node 3 or 4 can be seen. Only the left side of the amplifier, consisting of transistors 16, 22, 23, 24, 26, 27, 46, 47, 52, 54, 74, 79, 80, 81, 82, 85, 86, 86, 90, and 93, is reset when output node 3 goes high and only the right side of the amplifier, consisting of transistors 18, 25, 32, 33, 36, 37, 50, 59, 66, 67, 75, 103, 104, 107, 108, 110, 111, 115, 116, and 120, is reset when output node 4 goes high. Resetting only one side of the amplifier is sufficient since only one side of the amplifier changes from its standby state when the clock input signal CLKI falls. In other words, only changed nodes in the amplifier are reset when a changed output appears on node 3 or 4. Thus, as compared to an amplifier with true and complement outputs which applies a reset signal to all nodes, changed or not, amplifier 10 shown in FIG. 1 has reduced power consumption since a reset signal is applied to only half as many nodes.

Figure 2:
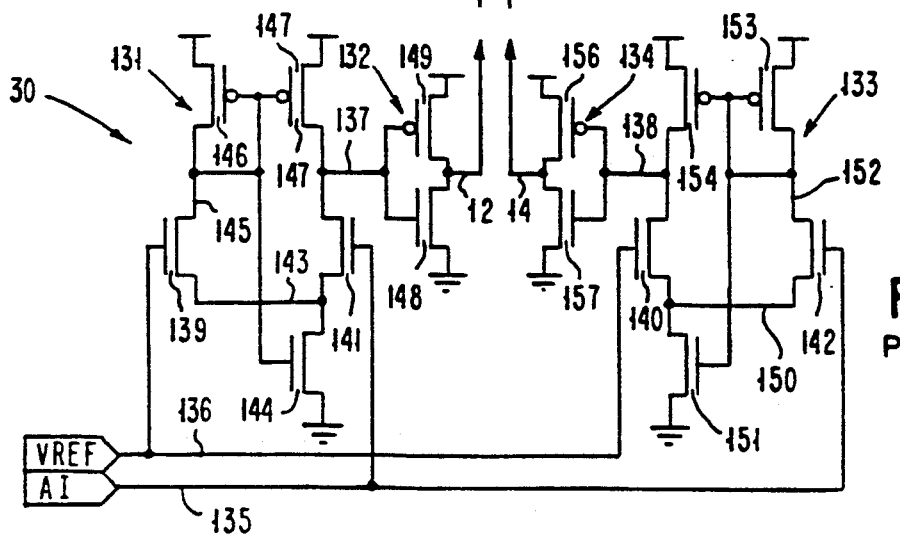
FIG. 2 is a schematic diagram of an ECL-level to CMOS-level conversion circuit with true and complement outputs.

FIG. 2 is a schematic diagram of a level shifting circuit for going from emittercoupled logic (ECL) to CMOS logic levels. Level shift circuit 130 has a signal input on lead 135 and a voltage reference input on lead 136. Leads 135 and 136 are coupled to differential amplifiers 131 and 133 which function to provide an output on leads 137 and 138 respectively to the input of inverters 132 and 134 respectively to provide respective outputs on leads 12 and 14. Lead 136 is coupled to the gate of transistors 139 and 140. Lead 135 is coupled to the gate of transistors 141 and 142. The sources of transistors 139 and 141 are coupled together over lead 143 to the drain of transistor 144. The source of transistor 144 is coupled to ground potential. The drain of transistor 139 is coupled over lead 145 to the drain of transistor 146 and the gates of transistors 146, 147 and 144. The sources of transistors 146 and 147 are coupled to a second voltage supply. The drains of transistors 141 and 147 are coupled together over lead 137 to the gates of transistors 148 and 149. The drains of transistors 148 and 149 are coupled together over lead 12. Transistors 148 and 149 are interconnected to form an inverter 132.

The sources of transistors 140 and 142 are coupled together over lead 150 to the drain of transistor 151. The source of transistor 151 is coupled to ground potential. The drain of transistor 142 is coupled over lead 152 to the drain of transistor 153 and the gates of transistors 151, 153 and 154. The sources of transistors 153 and 154 are coupled to a second voltage supply. The drains of transistors 154 and 140 are coupled together over lead 138 to the gates of transistors 156 and 157. Transistors 156 and 157 form a CMOS inverter 134. The drains of transistors 156 and 157 are coupled together over lead 14. Transistors 156 and 157 are interconnected to form an inverter 134.

In operation the input signal on lead 135 may be higher or lower than the reference voltage on lead 136. If the voltage on lead 135 is higher than the voltage on lead 136 then transistors 141 and 142 will be more conducting than transistors 139 and 140. Thus the voltage on leads 137 and 152 will tend to fall while the voltage on leads 145 and 138 will tend to rise. The higher voltage on lead 145 will cause transistor 144 to be more conducting, providing additional current for transistor 141 to pull lead 137 low. Also, the higher voltage on lead 145 will cause transistor 147 to be less conducting, helping lead 137 to go low. The low voltage on lead 137 passes through inverter 132 to be a high voltage on lead 12. In a complementary fashion, the lower voltage on lead 152 will make transistor 151 less conducting, providing less current for transistor 140 and helping lead 138 to go high, while transistor 154 will be more conducting reinforcing the tendency for lead 138 to go high. The high voltage on lead 138 passes through inverter 134 to provide a low voltage on lead 14.

Figure 3:
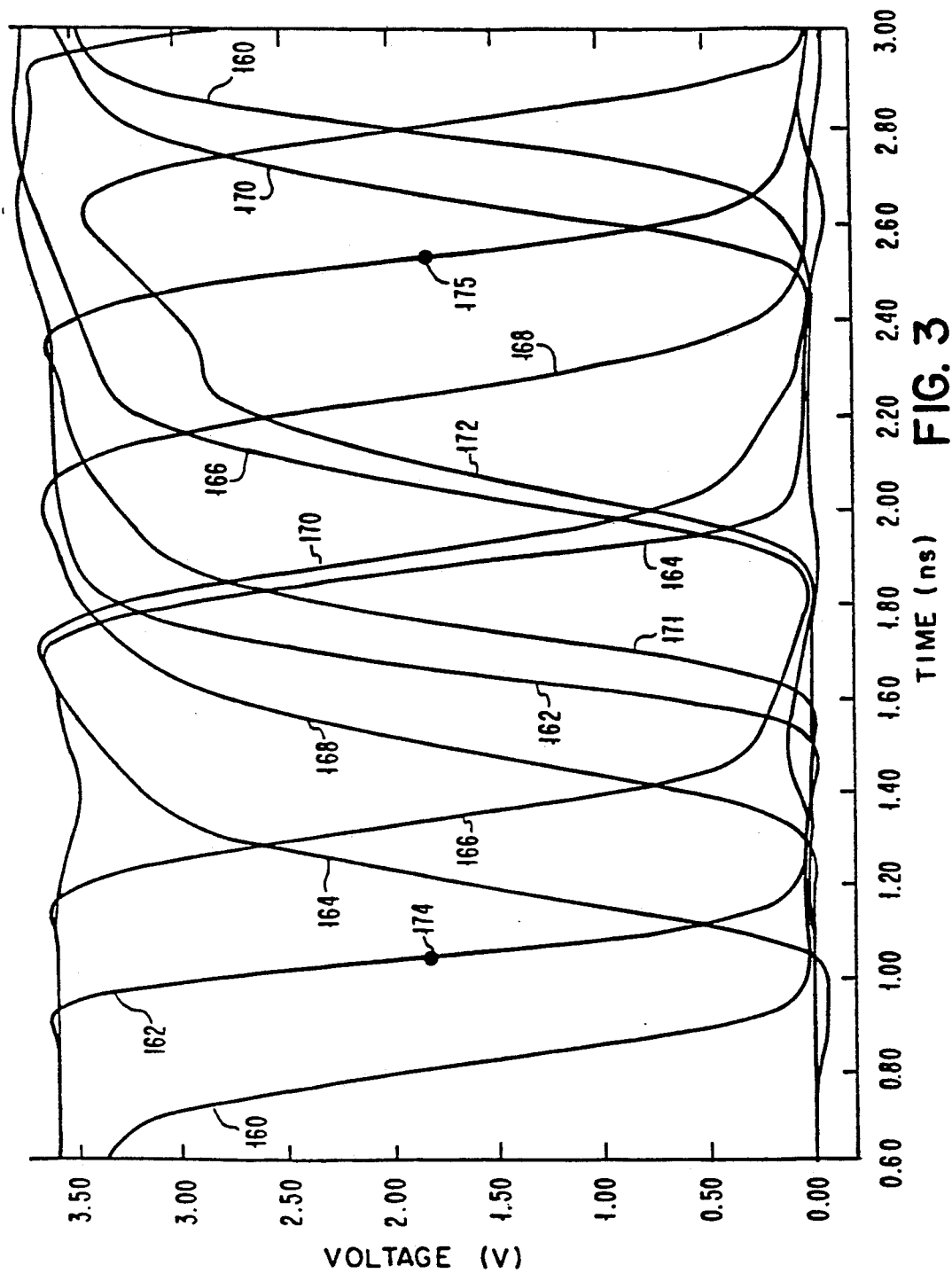
FIG. 3 is a graph showing waveforms for proper operation of the embodiment in FIG. 1.

FIG. 3 is a graph showing simulated waveforms for proper operation of circuit 10. In FIG. 3 the ordinate represents voltage and the abscissa represents time in nanoseconds. Curve 160 shows the waveform of the input signal on lead 12 shown in FIG. 1 to the gate of transistor 16. At 0.6 nanosecond in FIG. 3 curve 160 goes from 3.4 volts to 0 volts at 1.0 nanosecond. Signal CLKI, the clock signal goes from 3.6 volts to 0 volts from 0.8 nanosecond to 1.3 nanoseconds. Signal CLKI crosses 1.8 volts at 1.04 nanoseconds as shown by curve 162. The voltage on lead 20, node 1, goes from 0 volts to 1.8 volts at 1.2 nanoseconds as shown by curve 164. Curve 164 is going positive because transistor 16 is non-conducting and transistor 24 and 39 are conducting. The voltage on lead 44, the output of inverter 55 goes from 3.6 volts to 1.8 volts at 1.33 nanoseconds and continues to 0 volts as shown by curve 166. The voltage on lead 48, node 3, and also the output of inverter 56, carrying signal A0N goes from 0 volts to 1.8 volts at 1.49 nanoseconds and on to 3.6 volts as shown by curve 168. As the voltage on lead 48 goes high, the signal propagates through inverters 77 and 78 to lead 84 on the gate of transistor 22 causing transistor 22 to conduct thereby pulling the voltage on lead 20, node 1, low as shown by curve 164 which crosses 1.8 volts at 1.87 nanoseconds. Curve 171 shows the voltage on lead 84 going from 0 to 1.8 volts at 1.75 nanoseconds and then continuing to 3.6 volts. The voltage on lead 84 going high also causes the voltage on lead 88 to go low which is the output of inverter 87. Curve 170 shows the voltage on lead 88 going from 3.6 volts to 1.8 volts at 1.9 nanoseconds and further going to 0 volts. The low voltage on lead 88 causes transistor 54 to be conducting which pulls the voltage on lead 44 high. The voltage on lead 88 also passes through inverter 91 to its output on lead 92 which goes high causing transistor 93 to be conducting. Transistor 93 pulls the voltage on lead 48 low. The high voltage on lead 44 also helps to cause transistor 46 to be conducting also pulling the voltage on lead 48 low which crosses 1.8 volts at 2.24 nanoseconds as shown on curve 168 in FIG. 3. The voltage on lead 44 going high is shown by curve 166 where it crosses 1.8 volts at 2.04 nanoseconds as it goes up to 3.6 volts. The voltage on lead 92 which goes from 0 volts and crosses 1.8 volts at 2.09 nanoseconds is shown by curve 172. Clock signal CLKI goes from 0 volts and crosses 1.8 volts at 1.65 nanoseconds as shown by curve 162 as it goes up to 3.6 volts. When clock signal CLKI goes high, transistor 39 is turned off and transistors 23 and 33 are turned on which clamps and holds the voltage on nodes 1 and 2, leads 20 and 30 respectively at 0 volts.

Circuit 10 is ready to fire or sense again in 1.48 nanoseconds which is measured from the fall of clock signal CLKI as shown by point 174 on curve 162 at 1.04 nanoseconds to the point 175 on curve 171 at 2.52 nanoseconds. The fast cycle time is attributed to the fact that the reset of the amplifier begins, with only a short delay through inverters 77 and 78 or through inverters 100 and 101, after an output appears on node 3, lead 48, or node 4, lead 68 respectively. In other words, the amplifier is self-resetting; the amplifier does not require an external clock signal to begin reset. The delay from the time an output appears on node 3 or 4 before reset begins is selected, by varying the size of inverters 77, 78, 100, and 101, to provide a pulse width on output node 3 or 4 that is wide enough to reliably switch the circuits connected to these nodes. Since the amplifier is selfresetting, the clock drive can be dedicated to setting the first stage, the voltage on leads 20 and 30, nodes 1 and 2 respectively, and does not have to be loaded by the amplifier reset circuitry. With a minimum cycle time of 1.48 nanoseconds, circuit 10 could be used in a system with a 675MHz clock rate.

In FIG. 1 clock signal CLKI performs two functions. First, when the clock falls, the clock signal CLKI sets the first stage, nodes 1 and 2, leads 20 and 30 respectively. Second, when the clock is high, signal CLKI defines a standby state of circuit 10 by causing transistors 23 and 33 to be conducting pulling the voltage of nodes 1 and 2 low. The low on nodes 1 and 2 passes through inverters 55 and 69 and then through inverters 56 and 70 to define a low standby state on output nodes 3 and 4. It is noted that clock signal CLKI does not drive an inverter chain to provide clocking to the second stage consisting of inverters 55 and 69 or to the third stage comprising inverters 56 and 70. Further, in place of a rising clock signal being used to reset the amplifier stages, the amplifier stages are reset by the use of the changed ouput state which is logically coupled through a reset timing chain to the earlier stages, nodes 1 and 2, inverters 55 and 69, and nodes 3 and 4 of inverters 56 and 70. As compared to a conventional clocked amplifier without self-resetting circuitry, the circuit 10 in FIG. 1 has a better cycle time because the reset of circuit 10 has been totally decoupled from the clock input signal CLKI so that reset can begin as soon as a changed output state occurs. If the clock input were used to initiate reset, then to operated as reliably as circuit 10 in FIG. 1, the cycle time of the amplifier would have to be increased to include allowances for clock skew and for circuit variations of the amplifier compared to the clock. Also, for the same load on the clock signal CLKI, circuit 10 has higher gain between the clock input and the output at nodes 3 and 4 on leads 48 and 68 respectively.

For the simulated data taken in FIG. 3, the transistors had an effective gate length of 0.5 micrometers. The widths of the gates varied according to their function and the inverters 55, 56, 69, and 70 were asymmetric in that the n-channel transistor had a conductance much greater than or much less than the p-channel transistor. For example referring to FIG. 1, transistors 26 and 36 had 10 times the conductance of transistor 27 or 37 while transistors 47 and 67 had 10 times the conductance of transistor 46 or 66. Transistor 52 and 50 had 1.5 times the conductance of transistors 27 or 37 while transistors 74 and 75 had 1.5 times the conductance of transistor 46 or 66. Transistors 54 and 59 had the same conductance as transistor 26 or 36 while transistors 93 and 120 had the same conductance as transistor 47 or 67. Transistors 16 and 18 had 75% the conductance of transistor 22 or 32. Transistors 22 and 32 had 2 times the conductance of transistor 24 or 25. Transistors 23 and 33 had 10% the conductance of transistor 22 or 32 while transistor 39 had 2 times the conductance of transistor 24 or 25. Transistor 26 had 4 times the conductance of transistor 16 while transistor 47 had 3.5 times the conductance of transistor 26 so that the conductance gain through inverters 55 and 56 was 14. Likewise, transistor 36 had 4 times the conductance of transistor 18 while transistor 67 had 3.5 times the conductance of transistor 36 so that the conductance gain through inverters 69 and 70 was 14. The conductance of a transistor means the current carrying capability of the transistor when the transistor is turned on in the normal operation of the circuit.

The gate widths of inverters 77, 78, 87, 91, 100, 101, 112, and 118 were adjusted to provide a 750ps pulse width on output node 3 or 4 and to provide a cycle time less than 1.5 ns. It is noted that the output nodes 3 and 4 on leads 48 and 68 drive a lumped capacitance of 4 picofarads for the simulated data shown in FIG. 3.

FIGS. 1 and 2 have been shown utilizing CMOS transistors. It is noted that other types of transistors may be substituted in its place, for example n-channel metal-semiconductor field-effect transistors (MESFET) with resistor load or depletion loads. Complementary modulation-doped field-effect (MODFET) transistors may be used in FIGS. 1 and 2. Further, bipolar transistors of the NPN and PNP type with Schottky collector-base diodes may be used in FIG. 1 and FIG. 2.

It is further noted that transistors 24 and 25 as well as transistors 50 and 52 and 74 and 75 function as keep quiet latches to resist voltage changes at their drains due to noise after they have latched and to provide a means for steering current. A fast cycle time clocked CMOS amplifier has been described that uses dual, asynchronous differential preamplifiers to amplify an ECL level input signal to true and complement CMOS level signals as shown in FIG. 2. The preamplifiers shown in FIG. 2 are followed by 3 stages of differential amplification shown in FIG. 1 to provide true and complement signals for driving large loads (high capacitance loads). The first of these 3 stages is clocked by clock signal CLKI. The first stage consists of n-channel, current steering devices, which are differentially driven by the outputs from the dual preamplifiers 131 and 133 shown in FIG. 2, and a clocked p-channel latch circuit. Rapid amplification in the second and third stages is provided by heavily ratioed, asymmetric inverters with performance very close to that of fully clocked stages. A significant feature of the invention is the use of a changed output state on lead 48 or 68 to generate a signal to reset only the changed nodes of the clocked amplifier and thereby reduce cycle time and power consumption.

Having thus described our invention, what we claim as new and desire to secure by Letters Patents is:

1. A circuit for amplifying an input signal comprising:
 a first transistor having a first terminal adapted for coupling to a first voltage supply, a second terminal coupled to a first output node and a third terminal adapted for coupling to said input signal, a second transistor having a fourth terminal adapted for coupling to said first voltage supply, a fifth terminal coupled to a second output node and a sixth terminal adapted for coupling to a reference signal, first and second means for supplying current to said first and second output nodes, respectively, third means adapted for coupling to a clock signal for presetting the voltage of said first and second output nodes to a second voltage at first times and for disabling said third means at second times in response to said clock signal whereby at second times said first and second output nodes respond to said input signal, said first output node coupled through a first and second inverter to a third output node, said second output node coupled through a third and fourth inverter to a fourth output node, fourth means coupled to said third output node and to said first output node for resetting after a predetermined first delay the voltage of said first output node to said second voltage at times said third output node goes to a fourth voltage from a third voltage, and fifth means coupled to said fourth output node and to said second output node for resetting after a predetermined second delay the voltage of said second node to said second voltage at times said fourth output node goes to a fourth voltage from a third voltage, whereby a changed output state generates a signal to reset the voltage of the changed nodes of the circuit to reduce cycle time.

2. The circuit of claim 1 wherein said first transistor is a field effect transistor.

3. The circuit of claim 2 wherein said first terminal is the source, said second terminal is the drain and said third terminal is the gate.

4. The circuit of claim 2 wherein said second transistor is a field effect transistor.

5. The circuit of claim 4 wherein said fourth terminal is the source, said fifth terminal is the drain and said sixth terminal is the gate.

6. The circuit of claim 1 wherein said first and second transistors are n channel field effect transistors.

7. The circuit of claim 4 wherein said first means includes a third field-effect transistor having its gate coupled to said second output node, its drain coupled to said first output node and its source coupled to a source of current.

8. The circuit of claim 7 wherein said second means includes a fourth field-effect transistor having its gate coupled to said first output node, its drain coupled to said second output node and its source coupled to a source of current.

9. The circuit of claim 4 wherein said first means for supplying current includes a third field-effect transistor having its gate coupled to said clock signal, its source coupled to a source of current and its drain coupled to said first output node.

10. The circuit of claim 8 wherein said first means includes a fifth field-effect transistor having its gate coupled to said clock signal, its source coupled to a source of current and its drain coupled to said sources of said third and fourth field-effect transistors.

11. The circuit of claim 4 wherein said third means includes a third and fourth field-effect transistors having their source coupled to said first and second nodes respectively and their gate adapted for coupling to said clock signal.

12. The circuit of claim 1 wherein said first inverter includes a p channel transistor having a first conductivity in series with an n channel transistor having a conductivity greater than 5 times said first conductivity.

13. The circuit of claim 1 wherein said second inverter includes an n channel transistor having a first conductivity in series with a p channel transistor having a conductivity greater than 5 times said first conductivity.

14. The circuit of claim 1 wherein said first inverter includes a third transistor having a first conductivity greater than 3 times the conductivity of said first transistor.

15. The circuit of claim 14 wherein said second inverter includes a fourth transistor having a conductivity greater than 3 times the conductivity of said third transistor of said first inverter.

16. The circuit of claim 1 wherein said fourth means includes a third transistor having its drain coupled to said first node, its gate coupled to said third node, and its source coupled to said first voltage supply.

17. The circuit of claim 1 wherein said fourth means includes fifth and sixth inverters coupled in series to the gate of a third transistor having its drain coupled to said first node and its source coupled to said first voltage supply.

18. The circuit of claim 1 wherein said fourth means includes a transmission line to provide a fixed time delay.

19. The circuit of claim 17 wherein said fifth means includes seventh and eighth inverters coupled in series to the gate of a fourth transistor having its drain coupled to said second node and its source coupled to said first voltage supply.

20. The circuit of claim 17 wherein said fifth means includes a fourth transistor having its drain coupled to said second node, its gate coupled to said fourth node, and its source coupled to said first voltage supply.

21. The circuit of claim 1 wherein said fifth means includes fifth and sixth inverters coupled in series to the gate of a third transistor having its drain coupled to said second node and its source coupled to said first voltage supply.

22. The circuit of claim 1 wherein said fifth means includes a third transistor having its drain coupled to said second node, its gate coupled to said fourth node, and its source coupled to said first voltage supply.

* * * * *